(12) United States Patent
Kim et al.

(10) Patent No.: US 8,974,703 B2
(45) Date of Patent: *Mar. 10, 2015

(54) CONDUCTIVE PASTE AND ELECTRONIC DEVICE AND SOLAR CELL INCLUDING AN ELECTRODE FORMED USING THE SAME

(75) Inventors: Se Yun Kim, Seoul (KR); Eun Sung Lee, Seoul (KR); Sang Soo Jee, Gyeonggi-do (KR); In Yong Song, Gyeonggi-do (KR); Sang Mock Lee, Gyeonggi-do (KR); Do-Hyang Kim, Seoul (KR); Ka Ram Lim, Seoul (KR)

(73) Assignees: Samsung Electronics Co., Ltd., Gyeonggi-Do (KR); Industry-Academic Cooperation Foundation, Yonsei University of Yonsei Unversity, Seoul (KR)

( * ) Notice: Subject to any disclaimer, the term of this patent is extended or adjusted under 35 U.S.C. 154(b) by 234 days.

This patent is subject to a terminal disclaimer.

(21) Appl. No.: 13/281,835

(22) Filed: Oct. 26, 2011

(65) Prior Publication Data

US 2012/0103409 A1    May 3, 2012

(30) Foreign Application Priority Data

Oct. 27, 2010  (KR) .................... 10-2010-0105204
Jul. 27, 2011   (KR) .................... 10-2011-0074688

(51) Int. Cl.
*H01B 1/02* (2006.01)
*H01B 1/22* (2006.01)
(Continued)

(52) U.S. Cl.
CPC ............. *H01B 1/22* (2013.01); *B22F 1/0059* (2013.01); *B23K 35/001* (2013.01); *B23K 35/0244* (2013.01); *B23K 35/3006* (2013.01); *B23K 35/3013* (2013.01); *B23K 35/302* (2013.01); *B23K 35/3033* (2013.01); *C22C 9/00* (2013.01);
(Continued)

(58) Field of Classification Search
USPC ........................... 252/512–515; 136/256, 244
See application file for complete search history.

(56) References Cited

U.S. PATENT DOCUMENTS

| 4,434,084 A | 2/1984 | Hicks et al. |
| 4,962,066 A | 10/1990 | Starz |

(Continued)

FOREIGN PATENT DOCUMENTS

| CN | 101055776 A | 10/2007 |
| CN | 101186128 A | 5/2008 |

(Continued)

OTHER PUBLICATIONS

Mohamed M. Hilali et al., "Effect of Ag Particle Size in Thick-Film Ag Paste on the Electrical and Physical Properties of Screen Printed Contacts and Silicon Solar Cells," *J. Electromech. Soc.* vol. 153, No. 1, pp. A5-A11 (2006).

(Continued)

*Primary Examiner* — Khanh Tuan Nguyen
(74) *Attorney, Agent, or Firm* — Harness, Dickey & Pierce, P.L.C.

(57) ABSTRACT

A conductive paste may include a conductive powder, a metallic glass including a first element having a heat of mixing value with the conductive powder of less than 0, and an organic vehicle, and an electronic device and a solar cell may include an electrode formed using the conductive paste.

27 Claims, 5 Drawing Sheets

(51) Int. Cl.
*B22F 1/00* (2006.01)
*B23K 35/00* (2006.01)
*B23K 35/02* (2006.01)
*B23K 35/30* (2006.01)
*C22C 9/00* (2006.01)
*C22C 16/00* (2006.01)
*C22C 30/00* (2006.01)
*C22C 30/02* (2006.01)
*C22C 45/00* (2006.01)
*C22C 45/10* (2006.01)
*H01L 31/0224* (2006.01)
*C22C 1/00* (2006.01)

(52) U.S. Cl.
CPC .............. *C22C 16/00* (2013.01); *C22C 30/00* (2013.01); *C22C 30/02* (2013.01); *C22C 45/001* (2013.01); *C22C 45/10* (2013.01); *H01L 31/022425* (2013.01); *C22C 1/002* (2013.01); *Y02E 10/50* (2013.01)
USPC ........... 252/512; 252/513; 252/514; 252/515; 136/244; 136/256

(56) References Cited

U.S. PATENT DOCUMENTS

| | | | |
|---|---|---|---|
| 5,170,930 | A | 12/1992 | Dolbear et al. |
| 6,027,575 | A | 2/2000 | Paruchuri et al. |
| 6,420,067 | B1 | 7/2002 | Yoshioka |
| 7,056,394 | B2 | 6/2006 | Inoue et al. |
| 7,147,727 | B2 | 12/2006 | Kim et al. |
| 7,183,018 | B2 | 2/2007 | Kawakami et al. |
| 7,399,370 | B2 | 7/2008 | Inoue et al. |
| 7,947,134 | B2 | 5/2011 | Lohwongwatana et al. |
| 2002/0036034 | A1 | 3/2002 | Xing et al. |
| 2004/0245507 | A1 | 12/2004 | Nagai et al. |
| 2005/0019203 | A1 | 1/2005 | Saitoh et al. |
| 2005/0211340 | A1 | 9/2005 | Kim et al. |
| 2005/0228097 | A1 | 10/2005 | Zhong |
| 2006/0102228 | A1 | 5/2006 | Sridharan et al. |
| 2007/0031730 | A1 | 2/2007 | Kawakami et al. |
| 2007/0034305 | A1 | 2/2007 | Suh |
| 2007/0072969 | A1 | 3/2007 | Lee et al. |
| 2007/0102617 | A1 | 5/2007 | Lee et al. |
| 2007/0137737 | A1 | 6/2007 | Guo et al. |
| 2007/0157852 | A1 | 7/2007 | Lee et al. |
| 2008/0196794 | A1 | 8/2008 | Blandin et al. |
| 2009/0056798 | A1 | 3/2009 | Merchant et al. |
| 2009/0101190 | A1* | 4/2009 | Salami et al. ................ 136/244 |
| 2009/0211626 | A1 | 8/2009 | Akimoto |
| 2009/0250106 | A1 | 10/2009 | Hayashi et al. |
| 2009/0298283 | A1 | 12/2009 | Akimoto et al. |
| 2010/0037990 | A1 | 2/2010 | Suh |
| 2010/0096014 | A1 | 4/2010 | Iida et al. |
| 2010/0098840 | A1 | 4/2010 | Du et al. |
| 2010/0101637 | A1 | 4/2010 | Yamasaki et al. |
| 2011/0114170 | A1* | 5/2011 | Lee et al. ....................... 136/256 |
| 2011/0162687 | A1 | 7/2011 | Moon et al. |
| 2012/0031481 | A1 | 2/2012 | Jee et al. |
| 2012/0103409 | A1 | 5/2012 | Kim et al. |

FOREIGN PATENT DOCUMENTS

| | | |
|---|---|---|
| CN | 101359564 A | 2/2009 |
| EP | 1039568 B1 | 9/1999 |
| EP | 2325848 A2 | 5/2011 |
| EP | 2416327 A1 | 2/2012 |
| EP | 2448003 A2 | 5/2012 |
| EP | 2450908 A2 | 5/2012 |
| JP | 62-062870 | 3/1987 |
| JP | 10-040738 | 2/1998 |
| JP | 10144139 A | 5/1998 |
| JP | 2000-311681 A | 11/2000 |
| JP | 2002-080902 A | 3/2002 |
| JP | 2002-298651 | 10/2002 |
| JP | 2003-013103 A | 1/2003 |
| JP | 2003003246 A | 1/2003 |
| JP | 2004091868 A | 3/2004 |
| JP | 2005-050983 | 2/2005 |
| JP | 2008-010527 | 1/2008 |
| JP | 2010-018878 | 1/2009 |
| JP | 2009-099371 | 5/2009 |
| JP | 2009-138266 | 6/2009 |
| JP | 2009-197323 | 9/2009 |
| JP | 2010133021 A | 6/2010 |
| JP | 2010199196 A | 9/2010 |
| KR | 2002-0037772 | 5/2002 |
| KR | 1020050087249 A | 8/2005 |
| KR | 1020050096258 A | 10/2005 |
| KR | 10-0677805 | 1/2007 |
| KR | 1020070106887 A | 11/2007 |
| WO | WO 01/31085 | 5/2001 |
| WO | WO-2005/096320 A2 | 10/2005 |
| WO | WO 2005096320 A2 | 10/2005 |
| WO | WO 2009108675 A1 | 9/2009 |
| WO | WO 2010033281 | 3/2010 |

OTHER PUBLICATIONS

ASM Handbook. vol. 3 Alloy Phase Diagrams, *The Materials Information Soc.*, Hugh Baker, Ed., ASM International (1992).
US Office Action dated Dec. 10, 2012 corresponding to U.S. Appl. No. 13/016,403.
Partial European Search Report for 10190652.7-2102 dated Mar. 23, 2011.
European Search Report for 11177515.1-1218 dated Feb. 5, 2013.
European Search Report dated Dec. 20, 2011.
Lin et al., "Effect of Ni on glass-forming ability og Cu—Ti-based amorphous alloys", 2006, Transactions of Nonferrous Metals Society of China, 16, pp. 604-606.
Wang X et al.: "Atomic structure and glass formig ability of $Cu_{46}Zr_{46}Al_8$ bulk metallic glass", J. Appl. Phys. 104, 093519 (2008).
Arai et al., "Nanocrystal Formation of Metals in Thermally Grown Thin Silicon Dioxide Layer by Ion Implantation and Thermal Diffusion of Implanted Atoms in Heat Treatment", J. Phys. Conf., Ser. 61, 2007; 41-45.
Powell et al., Development of metallic glass loaded polymer paste, J. of Materials Processing Tech., 2001, pp. 318-323.
Schubert, G. et al., "Silver thick film contact formation on lowly doped phosphorous emitters", 2005, Proceedings 20th EPVSEC, Barcelona, pp. 934-937.
Kim S J et al: "Silver/metallic glass paste for shallow emitter Si-solar cell", 26th European Photovoltaic Solar Energy Conference and Exhibition, Sep. 5-9, 2011, pp. 492-494, XP009160654.
Lee S-W et al: "Design of a bulk amorphous alloy containing Cu—Zr with simultaneous improvement in glass-forming ability and plasticity", Journal of Materials Research, vol. 22, No. 02, Feb. 2007, pp. 486-492, XP55031306.
Kim Y C et al: "Enhanced glass forming ability and mechanical properties of new Cu-based bulk metallic glasses", Materials Science and Engineering A: Structual Materials: Properties, Microstructure & Processing, Lausanne, CH, vol. 437, No. 2, Nov. 15, 2006, pp. 248-253, XP027953056.
Neuhaus D-H et al: "Industrial Silicon Wafer Solar Cells", Advance in Optoelectronics, vol. 2007, XP 55031298.
Bashev V F et al: "Crystallization of Al—Ni alloys during rapid cooling", Russian Metallurgy, Allerton Press, Inc, No. 6, 1989, pp. 51-54, XP009160582.
Ivanov E et al: "Synthesis of nickel aluminides by mechanical alloying", Materials Letters, North Holland Publishing Company, Amsterdam, NL, vol. 7, No. 1-2, Aug. 1988, pp. 51-54, XP024149792.
Lim S S et al: "Assessment of the Al—Ag Binary Phase Diagram", CALPHAD, vol. 19, No. 2, 1995, pp. 131-141, XP55017954.
Wang Q et al: "Cluster line criterion and Cu—Zr—Al bulk metallic glass formation", Materials Science and Engineering A: Structural Materials: Properties, Microstructure & Processing, Lausanne, CH, vol. 449-451, Mar. 19, 2007, pp. 18-23, XP005914563.

(56) References Cited

OTHER PUBLICATIONS

Metallurgy Division of the Materials Science and Engineering Laboratory of NIST: "Ag—Cu—Sn System", Aug. 5, 2010, XP55031251, Retrieved from the Internet: http://web.archive.org/web/20100805072225/http://www.metallurgy.nist.gov/phase/solder/agcusn.html.
Oh C-S et al: "A thermodynamic study on the Ag—Sb—Sn system", Journal of alloys and compounds, elsevier sequoia, lausanne, CH, vol. 238, May 1, 1996, pp. 155-166, XP004080478.
Baren M R: "Ag—In (Silver—Indium)" in: White C E T, Okamoto H (Editors): "Phase Diagrams of Indium Alloys and their engineering applications", 1992, ASM International, Materials Park, XP008098250.
Gorshkov N N et al: "Explosive compaction of amorphous Cu—Sn powder prepared by the method of mechanical alloying", Combustion, Explosion, and shock waves, vol. 25, No. 2, 1989, pp. 244-247.
Salkar R A et al: "The sonochemical preparation of amorphous silver nanoparticles", Journal of materials chemistry, vol. 9, No. 6, 1999, pp. 1333-1335.
"Amorphous metal", Wikipedia, Oct. 21, 2010, XP55017848, Retrieved from the internet: URL://en.wikipedia.org/w/index.php?title=amorphous_metal&oldid=392080524.
"Electrical resitivity of pure metals" in: "CRC Handbook of chemistry and physics, 77th edition", 1996, CRC Press, Boca raton, New york, London, Tokyo, XP002668350.
US Office Action dated May 15, 2013 corresponding to U.S. Appl. No. 13/016,403.
US Office Action dated Jun. 5, 2013 corresponding to U.S. Appl. No. 12/943,732.
NIST, Properties of Lead-Free Solders, Release 4.0, Feb. 2002.
Se Yun Kim et al., "Replacement of oxide glass with metallic glass for Ag screen printing metallization on Si emitter" Applied Physics Letters 98, 222112, Jun. 3, 2011, whole document.
Yi, S. et al. "Ni-based bulk amorphous alloys in the Ni—Ti—Zr—(Si,Sn) system"; Journal of Materials Research, vol. 15, No. 11, p. 2425-2430; Nov. 2000.
Wang, W. "Roles of minor additions in formation and properties of bulk metallic glasses" Progress in Materials Science, vol. 52 p. 540-596; 2007.
Don-Ik Lee, et al., "Effect of TRITON™ X-based Dispersants Bearing a Carboyxlic Terminal Group on Rheological Properties of BAM/Ethyl Cellulose/Terpineol Paste", Journal of Applied Polymer Science, vol. 105, 2012-2019 (2007).
Don-Ik Lee, et al., "Plasma Display Material Prepared from a New Blue Phosphor Dispersion" Journal of Applied Polymer Science, vol. 108, 2571-2577 (2008).
Don-Ik Lee, et al., "Synthesis and Characterization of TRITON™ X-Based Surfactants with Carboxylic or Amino Groups in the Oxyethylene Chain End", Journal of Applied Polymer Science, vol. 104, 162-170 (2007).
M. Chen, "A brief overview of bulk metallic glasses", NPG Asia Materials, vol. 3, Step. 2011, pp. 82-90.
Reda, I.M., et al., "Amorphous Cu—Ag Films With High Stability," International Centre for Theoretical Physics, 1982.
US Office Action dated Aug. 23, 2013 corresponding to U.S. Appl. No. 13/016,403.
US Office Action dated Oct. 23, 2013 corresponding to U.S. Appl. No. 12/943,732.
Kenneth Barbalace. Periodic Table of Elements—Sorted by Atomic Radius. EnvironmentalChemistry.com. 1995 http://EnvironmentalChemistry.com/yogi/periodic/atomicradius.html.
US Office Action dated Jan. 31, 2014 corresponding to U.S. Appl. No. 13/348,169.
US Office Action dated Feb. 5, 2014 corresponding to U.S. Appl. No. 13/307,932.
Office Action dated Apr. 25, 2014 for corresponding U.S. Appl. No. 13/206,880.
Office Action dated May 1, 2014 for corresponding U.S. Appl. No. 12/943,732.
Hilali et al., "Effect of glass frit chemistry on the physical and electrical properties of thick-film Ag contacts for silicon solar cells", Journal of Electronic Materials. vol. 35, Issue 11, pp. 2041-2047, 2008.
Rane et al., "Effect of inorganic binders on the properties of silver thick films", Journal of Materials Science: Materials in Electronics, vol. 15, Issue 2, pp. 103-106; 2004.
Busch et al., "Viscosity of the supercooled liquid and relaxation at the glass transition of the bulk metallic glass forming alloy", Acta Materialia, vol. 46, Issue 13, pp. 4725-4732; 1998.
Kuo et al., "Measurement of low-temperature transport properties of Cu-based Cu—Zr—Ti bulk metallic glass", Physical Review B, vol. 74, pp. 014208-1 to 014208-7; 2006.
Japanese Office Action dated Apr. 1, 2014 for corresponding application No. JP 2010-252993.
Zhang et al. "Thermal and Mechanical Properties of Ti—Ni—Cu—Sn Amorphous Alloys with a Wide Supercooled Liquid Region before Crystallization"; Materials Transactions, vol. 39, p. 1001-1006; 1998.
Chinese Office Action dated Jun. 5, 2014 for corresponding Chinese application No. 201010544709, and English-language translation.
Notice of Allowance mailed Jun. 12, 2013, issued in related U.S. Appl. No. 13/208,705.
A. Ramirez, et at "Bonding nature of rare-earth-containing lead-free solders"; Applied Physics Letters, vol. 80, Issue 3, pp. 398-400; Jan. 2002.
A. Rehman, et al. "Review of the Potential of the Ni/Cu Plating Technique for Crystalline Silicone Solar Cells"; Materials, vol. 7, Issue 2, pp. 1318-1341; 2014.
S. Kim, et al. "Capillary flow of amorphous metal for high performance electrode"; Scientific Reports, vol. 3, Article 2185, pp. 1-7; 2013.
Notice of Allowance for corresponding U.S. Appl. No. 13/307,932 dated Sep. 11, 2014.
Notice of Allowance for corresponding U.S. Appl. No. 13 /348,169 dated Sep. 25, 2014.
Solder, retrieved from http://www.merriam-webster.com/dictionary/solder (Sep. 24, 2014).
Final Office Action for corresponding U.S. Appl. No. 13/206,880 dated Oct. 14, 2014.

* cited by examiner

CONDUCTIVE PASTE AND ELECTRONIC DEVICE AND SOLAR CELL INCLUDING AN ELECTRODE FORMED USING THE SAME

CROSS-REFERENCE TO RELATED APPLICATION

This application claims priority to and the benefit of Korean Patent Application No. 10-2010-0105204 filed in the Korean Intellectual Property Office on Oct. 27, 2010, and Korean Patent Application No. 10-2011-0074688 filed in the Korean Intellectual Property Office on Jul. 27, 2011, the entire contents of each of which are incorporated herein by reference.

BACKGROUND

1. Field

Example embodiments relate to a conductive paste, and an electronic device and a solar cell including an electrode formed using the conductive paste.

2. Description of the Related Art

A solar cell is a photoelectric conversion device that transforms solar energy into electrical energy. Solar cells have attracted attention a potentially infinite and pollution-free next generation energy source.

A solar cell includes p-type and n-type semiconductors, When an electron-hole pair ("EHP") is produced by light absorbed in a photoactive layer of the semiconductors, the solar cell produces electrical energy by transferring electrons and holes to the n-type and p-type semiconductors, respectively, and then collecting the electrons and holes in electrodes of the solar cell.

A solar cell should desirably have the highest possible efficiency for producing electrical energy from solar energy. In order to improve this efficiency, the solar cell desirably absorbs light with minor loss so that the solar cell may produce as many electron-hole pairs as possible, and collect the produced charges.

Further, an electrode of a solar cell may be manufactured in a screen-printing method using a conductive paste.

SUMMARY

Example embodiments provide a conductive paste which is capable of reducing charge loss and improving efficiency of a solar cell. Example embodiments also provide an electronic device including an electrode having the conductive paste. Example embodiments also provide a solar cell including an electrode including a product of the conductive paste.

According to example embodiments, a conductive paste may include a conductive powder, a metallic glass including a first element having a heat of mixing value with the conductive powder of less than 0, and an organic vehicle.

The eutectic temperature of the conductive powder and the first element may be lower than a firing temperature of the conductive paste. The firing temperature of the conductive paste may be about 1000° C. or lower. The firing temperature of the conductive paste may range from about 200 to about 1000° C.

The first element may include at least one of lanthanum (La), cerium (Ce), praseodymium (Pr), promethium (Pm), samarium (Sm), lutetium (Lu), yttrium (Y), neodymium (Nd), gadolinium (Gd), terbium (Tb), dysprosium (Dy), holmium (Ho), erbium (Er), thulium (Tm), thorium (Th), calcium (Ca), scandium (Sc), barium (Ba), beryllium (Be), bismuth (Bi), germanium (Ge), lead (Pb), ytterbium (Yb), strontium (Sr), europium (Eu), zirconium (Zr), thallium (Tl), lithium (Li), hafnium (Hf), magnesium (Mg), phosphorus (P), arsenic (As), palladium (Pd), gold (Au), plutonium (Pu), gallium (Ga), aluminum (Al), copper (Cu), zinc (Zn), antimony (Sb), silicon (Si), tin (Sn), titanium (Ti), cadmium (Cd), indium (In), platinum (Pt), and mercury (Hg).

The metallic glass may further include a second element and a third element, and the metallic glass may be an alloy having a composition represented by the following Chemical Formula 1:

$$A_x\text{-}B_y\text{-}C_z \qquad \text{[Chemical Formula 1]}$$

wherein A, B, and C are the first element, the second element, and the third element, respectively; x, y, and z are composition ratios of the first element, the second element, and the third element, respectively; and x+y+z=100.

The first element, the second element, and the third element may be included in a ratio satisfying the following Equation 1:

$$xy\Delta H_1 + yz\Delta H_2 + zx\Delta H_3 < 0 \qquad \text{[Equation 1]}$$

wherein $\Delta H_1$ is a heat of mixing value for the first element and the second element, $\Delta H_2$ is a heat of mixing value for the second element and the third element, and $\Delta H_3$ is a heat of mixing value for the third element and the first element.

The metallic glass may further include a second element, a third element, and a fourth element, and the metallic glass may be an alloy having a composition represented by the following Chemical Formula 2:

$$A_x\text{-}B_y\text{-}C_z\text{-}D_w \qquad \text{[Chemical Formula 2]}$$

wherein A, B, C, and D are the first element, the second element, the third element, and the fourth element, respectively; x, y, z, and w are composition ratios of the first element, the second element, the third element, and the fourth element, respectively; and x+y+z+w=100.

The first element, the second element, the third element, and the fourth element may be included in a ratio satisfying the following Equation 2:

$$xy\Delta H_1 + yz\Delta H_2 + zw\Delta H_3 + wx\Delta H_4 + zy\Delta H_5 + yw\Delta H_6 < 0 \qquad \text{[Equation 2]}$$

wherein $\Delta H_1$ is a heat of mixing value for the first element and the second element, $\Delta H_2$ is a heat of mixing value for the second element and the third element, $\Delta H_3$ is a heat of mixing value for the third element and the fourth element, $\Delta H_4$ is a heat of mixing value for the fourth element and the first element, $\Delta H_5$ is a heat of mixing value for the first element and the third element, and $\Delta H_6$ is a heat of mixing value for the second element and the third element.

The conductive powder may have resistivity of about 100 μΩcm or less. The conductive powder may include at least one of silver (Ag), aluminum (Al), copper (Cu), nickel (Ni), and a combination thereof. The conductive powder, the metallic glass, and the organic vehicle may be included at about 30 to 99 wt %, about 0.1 to 20 wt %, and about 0.9 to 69.9 wt %, respectively, based on the total amount of conductive paste.

According to example embodiments, an electronic device may include an electrode formed using the conductive paste. The conductive paste includes a conductive powder, a metallic glass including a first element having a heat of mixing value with the conductive powder of less than 0, and an organic vehicle.

According to example embodiments, a solar cell may include an electrode electrically connected with a semiconductor layer. The electrode may be formed using the conductive paste of example embodiments.

The electrode may include a buffer layer at a region adjacent to the semiconductor layer, and an electrode portion at another region different from the region where the buffer layer is formed. At least one of the buffer layer, the interface of the semiconductor layer and the buffer layer, and the semiconductor layer includes the conductive material that is crystallized.

The eutectic temperature of the conductive powder and the first element may be lower than the firing temperature of the conductive paste. The conductive paste may have a firing temperature of less than about 1000° C.

The first element may include at least one of lanthanum (La), cerium (Ce), praseodymium (Pr), promethium (Pm), samarium (Sm), lutetium (Lu), yttrium (Y), neodymium (Nd), gadolinium (Gd), terbium (Tb), dysprosium (Dy), holmium (Ho), erbium (Er), thulium (Tm), thorium (Th), calcium (Ca), scandium (Sc), barium (Ba), beryllium (Be), bismuth (Bi), germanium (Ge), lead (Pb), ytterbium (Yb), strontium (Sr), europium (Eu), zirconium (Zr), thallium (Tl), lithium (Li), hafnium (Hf), magnesium (Mg), phosphorus (P), arsenic (As), palladium (Pd), gold (Au), plutonium (Pu), gallium (Ga), aluminum (Al), copper (Cu), zinc (Zn), antimony (Sb), silicon (Si), tin (Sn), titanium (Ti), cadmium (Cd), indium (In), platinum (Pt), and mercury (Hg).

The metallic glass may further include a second element and a third element, and the metallic glass may be an alloy having a composition represented by the following Chemical Formula 1:

$$A_x\text{-}B_y\text{-}C_z \qquad \text{[Chemical Formula 1]}$$

In the Chemical Formula 1, A, B, and C are the first element, the second element, and the third element, respectively; x, y, and z are the composition ratios of the first element, the second element, and the third element, respectively; and x+y+z=100.

The first element, the second element, and the third element may be included in a ratio satisfying the following Equation 1:

$$xy\Delta H_1 + yz\Delta H_2 + zx\Delta H_3 < 0 \qquad \text{[Equation 1]}$$

In Equation 1, $\Delta H_1$ is a heat of mixing value for the first element and the second element, $\Delta H_2$ is a heat of mixing value for the second element and the third element, and $\Delta H_3$ is a heat of mixing value for the third element and the first element.

The metallic glass may further include a second element, a third element, and a fourth element, and the metallic glass may be an alloy having a composition represented by the following Chemical Formula 2:

$$A_x\text{-}B_y\text{-}C_z\text{-}D_w \qquad \text{[Chemical Formula 2]}$$

In the Chemical Formula 2, A, B, C, and D are the first element, the second element, the third element, and the fourth element, respectively; x, y, z, and w are the composition ratios of the first element, the second element, the third element, and the fourth element, respectively; and x+y+z+w=100.

The first element, the second element, the third element, and the fourth element may be included in a ratio satisfying the following Equation 2:

$$xy\Delta H_1 + yz\Delta H_2 + zw\Delta H_3 + wx\Delta H_4 + xz\Delta H_5 + yw\Delta H_6 < 0 \qquad \text{[Equation 2]}$$

In Equation 2, $\Delta H_1$ is a heat of mixing value for the first element and the second element, $\Delta H_2$ is a heat of mixing value for the second element and the third element, $\Delta H_3$ is a heat of mixing value for the third element and the fourth element, $\Delta H_4$ is a heat of mixing value for the fourth element and the first element, $\Delta H_5$ is a heat of mixing value for the first element and the third element, and $\Delta H_6$ is a heat of mixing value for the second element and the third element.

The conductive powder may have a resistivity ranging from about 100 μΩcm or less. The conductive powder may include at least one of silver (Ag), aluminum (Al), copper (Cu), nickel (Ni), and a combination thereof.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
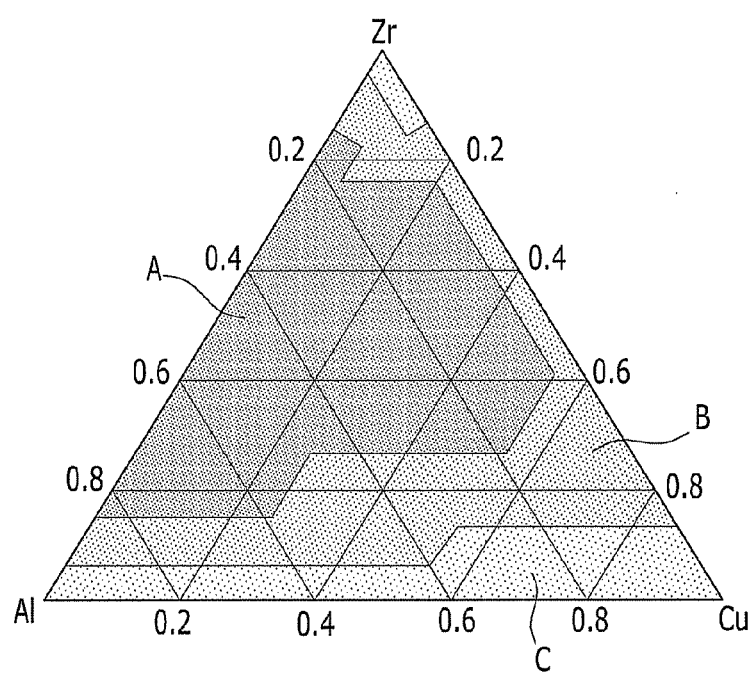
FIG. 1 is a schematic view showing a heat of mixing value for a ternary alloy according to example embodiments including Al—Cu—Zr depending upon the ratio of each element.

Example embodiments will hereinafter be described in detail, and may be easily performed by those who have common knowledge in the related art. This disclosure may, however, be embodied in many different forms and should not be construed as limited to example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. Hereinafter, the term 'element' refers to a metal and a semimetal.

A conductive paste according to example embodiments includes a conductive powder, a metallic glass including a first element having a heat of mixing value of less than 0 with the conductive powder, and an organic vehicle.

The conductive powder may be selected from the metal having a resistivity of about 100 μΩcm or less. The conductive powder may be, for example, at least one of a silver (Ag)-containing metal, e.g., silver or a silver alloy, an aluminum (Al)-containing metal, e.g., aluminum or an aluminum alloy, a copper (Cu)-containing metal, e.g., copper (Cu) or a copper alloy, a nickel (Ni)-containing metal, e.g., nickel (Ni) or a nickel alloy, and a combination thereof. However, example embodiments are not limited thereto, and may be a different kind of metal or may include an additive other than the metal.

The conductive powder may have a particle size (e.g., average particle size) ranging from about 1 nm to about 50 μm, for example, about 0.1 to about 50 μm. The conductive powder may also have a particle size ranging from about 0.5 to about 40 μm, for example, about 1 to about 30 μm.

The metallic glass may include an alloy having a disordered atomic structure including two or more elements. The metallic glass may be an amorphous metal. Because the metallic glass has a relatively low resistance, which is different from an insulating glass, e.g., a silicate, the metallic glass may be an electrical conductor at a voltage and a current of a solar cell.

The metallic glass may include a first element having a heat of mixing value of less than 0 with the conductive powder. The heat of mixing value of less than 0 means that two materials may be thermodynamically mixed spontaneously when they are in a melted state. What the heat of mixing value for the conductive powder and the first element being less than 0 means is that the conductive powder and the first element may spontaneously form a solid solution in a melted state.

When the eutectic temperature of the conductive powder and the first element is lower than the firing temperature of the conductive paste, the conductive powder and the first element may be in a melted state while firing the conductive paste, and the melted conductive powder may be solid-dissolved and diffused into the first element in a melted state.

The conductive paste may have a firing temperature of about 1000° C. or lower, for example, of about 200° C. to about 1000° C., so the metallic glass may be selected from elements capable of providing a eutectic state with the conductive powder within the temperature range.

For example, when the conductive powder is a silver (Ag)-containing metal, the first element capable of providing a solid solution with the conductive powder at about 1000° C. or lower may be at least one of lanthanum (La), cerium (Ce), praseodymium (Pr), promethium (Pm), samarium (Sm), lutetium (Lu), yttrium (Y), neodymium (Nd), gadolinium (Gd), terbium (Tb), dysprosium (Dy), holmium (Ho), erbium (Er), thulium (Tm), thorium (Th), calcium (Ca), scandium (Sc), barium (Ba), beryllium (Be), bismuth (Bi), germanium (Ge), lead (Pb), ytterbium (Yb), strontium (Sr), europium (Eu), zirconium (Zr), thallium (Tl), lithium (Li), hafnium (Hf), magnesium (Mg), phosphorus (P), arsenic (As), palladium (Pd), gold (Au), plutonium (Pu), gallium (Ga), aluminum (Al), copper (Cu), zinc (Zn), antimony (Sb), silicon (Si), tin (Sn), titanium (Ti), cadmium (Cd), indium (In), platinum (Pt), and mercury (Hg).

The conductive powder may be a silver (Ag)-containing metal, but example embodiments are not limited thereto. The conductive powder may be selected from various elements when other metals are included.

The metallic glass may be a ternary alloy further including a second element and a third element other than the first element.

When the metallic glass is a ternary alloy, the ternary alloy may be represented by the Chemical Formula 1.

$$A_x\text{-}B_y\text{-}C_z \qquad \text{[Chemical Formula 1]}$$

In the Chemical Formula 1, A, B, and C are the first element, the second element, and the third element, respectively; x, y, and z are the composition ratios of the first element, the second element, and the third element, respectively; and x+y+z=100.

In the composition of the metallic glass, the composition ratio of the first element for increasing the solid solubility of the conductive powder may be determined in the ratio for satisfying the following Equation 1.

$$xy\Delta H_1 + yz\Delta H_2 + zx\Delta H_3 < 0 \qquad \text{[Equation 1]}$$

In the Equation 1, $\Delta H_1$ is a heat of mixing value for the first element and the second element; $\Delta H_2$ is a heat of mixing value for the second element and the third element; and $\Delta H_3$ is a heat of mixing value for the third element and the first element.

As in Equation 1, when the total heat of mixing value of the metallic glass is less than 0, the composition of the metallic glass is thermodynamically stabilized, so as to determine the ratio (x) of the amount of the first element for increasing the solid solubility within the range.

The metallic glass may be an alloy including at least two elements. For example, the first element may be aluminum (Al), and the second element and the third element may be copper (Cu) and zirconium (Zr), respectively.

When the metallic glass is a ternary alloy including Al, Cu, and Zr in x %, y %, and z %, respectively, and when the heat of mixing value for Al—Cu is $\Delta H_1$, the heat of mixing value for Cu—Zr is $\Delta H_2$ and the heat of mixing value for Zr—Al is $\Delta H_3$, and the amount of the first element of Al may be determined within the range to provide the total heat of mixing value for metallic glasses of $xy\Delta H_1 + yz\Delta H_2 + zx\Delta H_3$ to be less than 0.

FIG. 1 is a schematic view showing a heat of mixing value for a ternary alloy according to example embodiments including Al—Cu—Zr depending upon the ratio of amount of each element.

Referring to FIG. 1, the region A is a region having a heat of mixing value that satisfies $-10 \leq xy\Delta H_1 + yz\Delta H_2 + zx\Delta H_3 \leq -6$; the region B is a region having a heat of mixing value that satisfies $-6 \leq xy\Delta H_1 + yz\Delta H_2 + zx\Delta H_3 \leq -3$; and the region C is a region having a heat of mixing value that satisfies $-3 \leq xy\Delta H_1 + yz\Delta H_2 + zx\Delta H_3 < 0$.

The values x, y, and z may be determined within the range to provide a suitable total heat of mixing value referring to FIG. 1.

The metallic glass may be, for example, $Cu_{58.1}Zr_{35.9}Al_6$ and $Cu_{46}Zr_{46}Al_8$.

The metallic glass may be a quaternary alloy further including a second element, a third element, and a fourth element other than the first element.

When the metallic glass is a quaternary alloy, the metallic glass may be represented by the Chemical Formula 2.

$$A_x\text{-}B_y\text{-}C_z\text{-}D_w \quad \text{[Chemical Formula 2]}$$

In the Chemical Formula 2, A, B, C, and D are the first element, the second element, the third element, and the fourth element, respectively; x, y, z, and w are the composition ratios of the first element, the second element, the third element, and the fourth element, respectively; and $x+y+z+w=100$.

In the composition of the metallic glass, the composition ratio of the first element for increasing the solid solubility of the conductive powder may be determined in the ratio for satisfying the following Equation 2.

$$xy\Delta H_1 + yz\Delta H_2 + zw\Delta H_3 + wx\Delta H_4 + xz\Delta H_5 + yw\Delta H_6 < 0 \quad \text{[Equation 2]}$$

In the Equation 2, $\Delta H_1$ is a heat of mixing value for the first element and the second element; $\Delta H_2$ is a heat of mixing value for the second element and the third element; $\Delta H_3$ is a heat of mixing value for the third element and the fourth element; $\Delta H_4$ is a heat of mixing value for the fourth element and the first element; $\Delta H_5$ is a heat of mixing value for the first element and the third element; and $H_6$ is a heat of mixing value for the second element and the third element.

As in Equation 2, when the total heat of mixing value of the metallic glass is less than 0, the composition of the metallic glass is thermodynamically stabilized, so as to determine the ratio (x) of the amount of the first element for increasing the solid solubility within the range.

The metallic glass may be an alloy including at least two elements. For example, the first element may be aluminum (Al), and the second element, the third element, and the fourth element may be copper (Cu), zirconium (Zr), and beryllium (Be), respectively.

When the metallic glass is a quaternary alloy including Al, Cu, Zr, and Be in x %, y %, z %, and w %, respectively, and when the heat of mixing value for Al—Cu is $\Delta H_1$, the heat of mixing value for Cu—Zr is $\Delta H_2$, the heat of mixing value for Zr—Be is $\Delta H_3$, and the heat of mixing value for Be—Al is $\Delta H_4$, and the amount of the first element of Al may be determined within the range to provide the total heat of mixing value for metallic glasses of $xy\Delta H_1 + yz\Delta H_2 + zw\Delta H_3 + wx\Delta H_4$ to be less than 0.

The metallic glass may be, for example, $Cu_{45}Zr_{45}Al_8Be_2$.

The organic vehicle may include an organic compound and a solvent. The organic compound may be contacted (e.g., mixed) with the conductive powder and the metallic glass to impart viscosity. The solvent may dissolve or suspend the foregoing components.

The organic compound may include, for example, at least one selected from a (meth)acrylate; a cellulose, e.g., ethyl cellulose; a phenol; an alcohol; a tetrafluoroethylene (e.g., TEFLON®); and a combination thereof, and may further include an additive, e.g., a surfactant, a thickener, or a stabilizer, or a combination thereof.

The solvent may be any solvent which is capable of dissolving or suspending any of the above compounds and may include, for example, at least one selected from terpineol, butylcarbitol, butylcarbitol acetate, pentanediol, dipentyne, limonene, ethyleneglycol alkylether, diethyleneglycol alkylether, ethyleneglycol alkylether acetate diethyleneglycol alkylether acetate, diethyleneglycol dialkylether, triethyleneglycol alkylether acetate, triethylene glycol alkylether, propyleneglycol alkylether, propyleneglycol phenylether, dipropyleneglycol alkylether, tripropyleneglycol alkylether, propyleneglycol alkylether acetate, dipropyleneglycol alkylether acetate, tripropyleneglycol alkyl ether acetate, dimethylphthalate, diethylphthalate, dibutylphthalate, and/or desalted water.

The conductive powder, the metallic glass, and organic vehicle may be included in amounts of about 30 wt % to about 99 wt %, about 0.1 wt % to about 20 wt %, and about 0.9 wt % to about 69.9 wt %, based on the total amount of the conductive paste, respectively.

The conductive paste may be disposed by screen-printing to provide an electrode for an electronic device. When the electrode is obtained by applying the conductive paste, for example, on the semiconductor substrate, the conductive powder may form a solid solution with the metallic glass including the first element and may diffuse into the melted metal glass as described below with reference to FIG. 2A to FIG. 2D.

FIG. 2A to FIG. 2D are cross-sectional views schematically illustrating a conductive structure including a conductive powder that forms a solid solution with and is diffused into a metallic glass when the conductive paste according to example embodiments is applied on a semiconductor substrate 110.

Figure 2A:
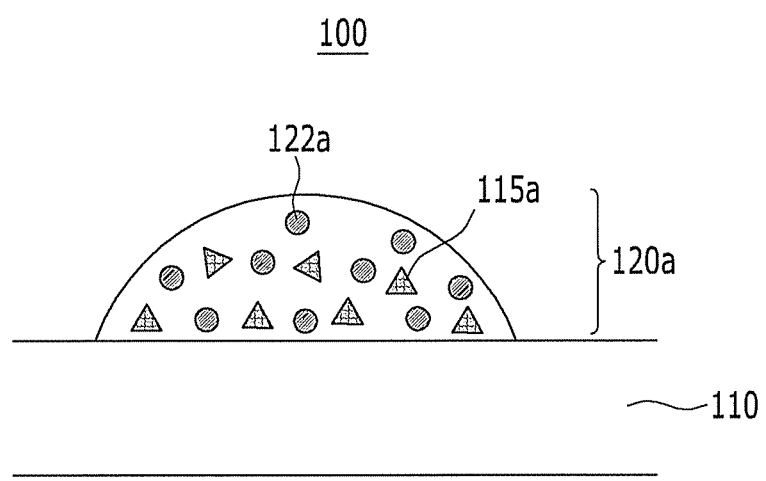
FIG. 2A to FIG. 2D are cross-sectional views schematically illustrating a conductive structure according to example embodiments including a conductive powder that forms a solid solution with and is diffused into a metallic glass.
Figure 2B:
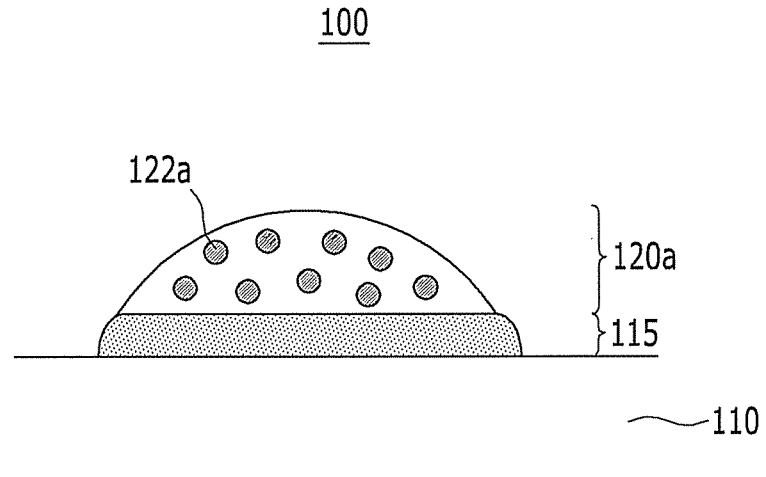

Referring to FIG. 2A, a conductive structure 100 may include a conductive paste 120a applied on a semiconductor substrate 110. The conductive paste 120a may include a conductive powder 122a and a metallic glass 115a, which are each separately present as particles. Referring to FIG. 2B, when the conductive structure 100 is heated above the glass transition temperature (Tg) of the metallic glass 115a, the metallic glass 115a may soften and demonstrate liquid-like behavior. The softened metallic glass 115a may demonstrate wettability on the semiconductor substrate 110 to provide a buffer layer 115. The buffer layer 115 may closely contact a relatively wide area of semiconductor substrate 110. Because the metallic glass 115a has a lower glass transition temperature (Tg) than the sintering temperature of the conductive powder 122a, the conductive powder 122a may still be present as particles in the conductive paste 120a. Thereby, the electrode prepared by using the conductive paste may include a buffer layer positioned at a region which is adjacent to the semiconductor substrate, and an electrode portion positioned at a region other than a region where the buffer layer is formed, for example, on the buffer layer.

Figure 2C:
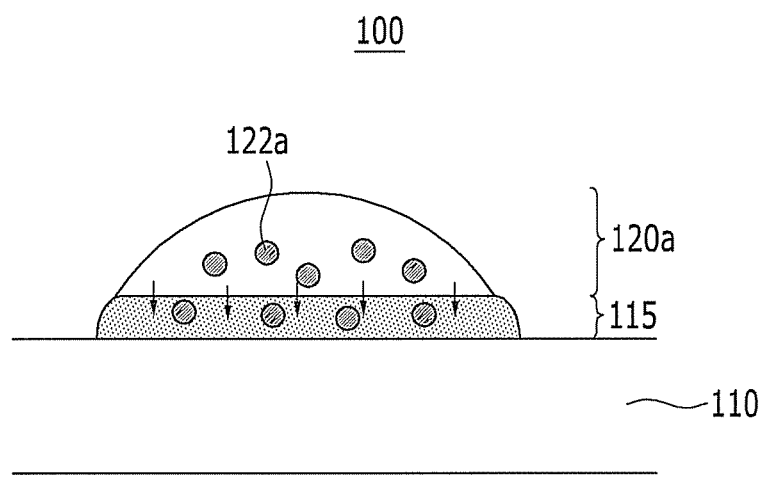

Referring to FIG. 2C, when the conductive structure 100 is heated above the eutectic temperature of the conductive powder 122a and the metallic glass, the conductive powder 122a and the metallic glass enter a eutectic state, and a portion of the conductive powder 122a may form a solid solution with the metallic glass and diffuse into the buffer layer 115.

Figure 2D:
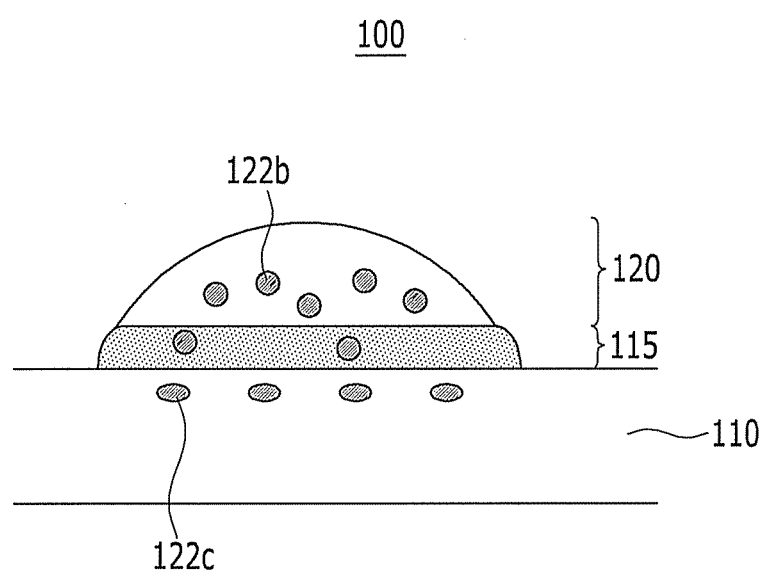

Referring to FIG. 2D, a portion of the conductive powder 122a (see FIG. 1C) diffused into the buffer layer 115 may be further diffused into the semiconductor substrate 110 and/or the interface of the semiconductor substrate 110 and buffer layer 115. When cooling the semiconductor substrate 110, the conductive powder may be recrystallized to provide a front electrode portion 120 including a first conductive powder 122b that is recrystallized, and the second conductive powder 122c that permeated into the semiconductor substrate 110 may also be recrystallized.

Accordingly, a front electrode portion 120 formed with the first conductive powder 122b is provided, and a buffer layer 115 including metallic glass may be formed between the front electrode portion 120 and the semiconductor substrate 110. The second conductive powder 122c may be permeated into the semiconductor substrate 110 and recrystallized.

The second conductive powder 122c present in the semiconductor substrate 110 may effectively transmit electrons produced in the semiconductor substrate 110 by solar light through the buffer layer 115 into the front electrode portion 120, and may simultaneously decrease the contact resistance between the semiconductor substrate 110 and the electrode portion 120 thereby reducing the electron loss and enhancing the efficiency of the solar cell.

Figure 3:
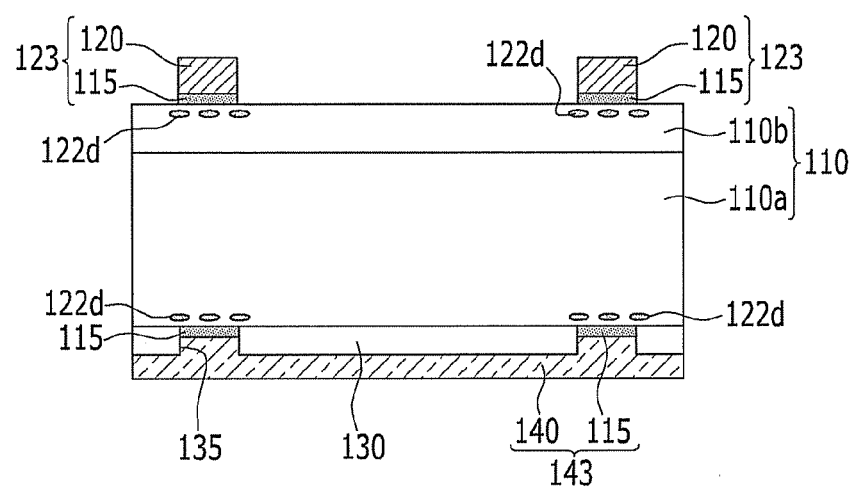
FIGS. 3-4 are cross-sectional views illustrating a solar cell according to example embodiments.

Referring to FIG. 3, the solar cell according to example embodiments is described. FIG. 3 is a cross-sectional view showing a solar cell according to example embodiments.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, for the better understanding and ease of description, the upper and lower positional relationship is described with respect to a semiconductor substrate 110, but is not limited thereto. In addition, "front side" refers to the side receiving solar energy, and "rear side" refers to the side opposite to the front side hereinafter.

Referring to FIG. 3, the solar cell 200 according to example embodiments may include a semiconductor substrate 110 including a lower semiconductor layer 110a and an upper semiconductor layer 110b.

The semiconductor substrate 110 may be formed of a crystalline silicon or compound semiconductor. The crystalline silicon may be, for example, a silicon wafer. One of the lower semiconductor layer 110a and the upper semiconductor layer 110b may be a semiconductor layer doped with a p-type impurity, and the other may be a semiconductor layer doped with an n-type impurity. For example, the lower semiconductor layer 110a may be a semiconductor layer doped with a p-type impurity, and the upper semiconductor layer 110b may be a semiconductor layer doped with an n-type impurity. Herein, the p-type impurity may be a Group IIIA element, e.g., boron (B), and the n-type impurity may be a Group VA element, e.g., phosphorus (P).

The surface of the upper semiconductor layer 110b may be subjected to surface texturing. The surface-textured upper semiconductor layer 110b may have protrusions and depressions, e.g., in a pyramid shape, or a porous structure, e.g., a honeycomb shape. The surface-textured upper semiconductor layer 110b may have an enlarged surface area to enhance the light-absorption rate and decrease reflectivity, thereby improving efficiency of a solar cell.

A plurality of front electrodes 123 may be disposed on the upper semiconductor layer 110b. The plurality of front electrodes 123 are arranged in parallel to the direction of the substrate 110, and may be designed in a grid pattern to reduce shadowing loss and sheet resistance.

A front electrode of the plurality of front electrodes 123 may include a buffer layer 115 positioned at a region which is adjacent to the upper semiconductor layer 110b, and the front electrode portion 120 positioned at a region other than a region where the buffer layer 115 is formed. FIG. 3 shows that the buffer layer 115 is formed on the upper semiconductor layer 110b, but is not limited thereto. The buffer layer 115 may be omitted, or may be formed on a separate part of the upper semiconductor layer 110b.

The front electrode may be disposed by a screen printing method using a conductive paste. The conductive paste is the same as described above.

The front electrode portion 120 may be formed of a conductive material, for example, a low resistance conductive material such as at least one of silver (Ag), aluminum (Al), copper (Cu), nickel (Ni) and/or a combination thereof.

A conductive buffer layer 115 may be disposed between the upper semiconductor layer 110b and the front electrode portion 120. The conductive buffer layer 115 may have conductivity due to a metallic glass. Because the conductive buffer layer 115 has parts that contact the front electrode portion 120 and the upper semiconductor layer 110b, the conductive buffer layer 115 may decrease loss of electric charges by enlarging the path for transferring electric charges between the upper semiconductor layer 110b and the front electrode portion 120.

The metallic glass in the conductive buffer layer 115 may be a component included in the conductive paste for the front electrode portion 120 and may be softened before the conductive material for the front electrode portion 120 during processing, so that the metallic glass may be disposed under the front electrode portion 120.

The crystallized conductive powder 122d may be present in the buffer layer 115, the upper semiconductor layer 110b disposed under the buffer layer 115 and/or the interface of the upper semiconductor layer 110b and the buffer layer 115. The crystallized conductive powder 122d may be melted during the firing process to form a front electrode using the conductive paste, passed through the buffer layer 115, diffused into the upper semiconductor layer 110b, and crystallized. The crystallized conductive powder 122d may decrease the contact resistance between the upper semiconductor layer 110b and the front electrode portion 120 together with the buffer layer 115, and improve the electrical characteristics of the solar cell.

A bus bar electrode (not shown) may be disposed on the front electrode portion 120. The bus bar electrode connects adjacent solar cells during assembly of a plurality of solar cells.

A dielectric layer 130 may be disposed under the semiconductor substrate 110. The dielectric layer 130 may increase efficiency of a solar cell by preventing or inhibiting recombination of electric charges and leakage of a current. The dielectric layer 130 may include a plurality of through-holes 135, and the semiconductor substrate 110 and a rear electrode that will be described may contact through the through-holes 135.

The dielectric layer 130 may be formed with at least one of silicon oxide ($SiO_2$), silicon nitride ($SiN_x$), aluminum oxide ($Al_2O_3$), and a combination thereof, and may have a thickness of about 100 Å to about 2000 Å.

The rear electrode 143 may be disposed under the dielectric layer 130. The rear electrode 143 may be formed of a conductive material, for example, an opaque metal such as aluminum (Al). The rear electrode 143 may be disposed by a screen printing method using a conductive paste in the same manner as the plurality of front electrodes 123.

The rear electrode 143 may include a buffer layer 115 positioned at a region which is adjacent to the lower semiconductor layer 110a, and a rear electrode portion 140 positioned at a region other than a region where the buffer layer 115 is formed and including a conductive material in the same manner as the plurality of front electrodes. However, example embodiments are not limited thereto. The buffer layer may be omitted, or may be formed on a separate part of the lower semiconductor layer 110a.

The crystallized conductive powder 122d may be present in the buffer layer 115, the lower semiconductor layer 110a disposed on the buffer layer 115 and/or the interface of the lower semiconductor layer 110a. The crystallized conductive powder 122d may be melted during the firing process to form a rear electrode using the conductive paste, passed through the buffer layer 115, diffused into the lower semiconductor layer 110a, and crystallized. The crystallized conductive powder 122d may decrease the contact resistance between the lower semiconductor layer 110a and the rear electrode portion 140 together with the buffer layer 115, and improve the electrical characteristics of the solar cell.

Hereinafter, a method of manufacturing the solar cell is described with reference to FIG. 3. A semiconductor substrate 110 such as a silicon wafer is prepared. The semiconductor substrate 110 may be doped with a p-type impurity, as an example.

Then the semiconductor substrate 110 is subjected to a surface texturing treatment. The surface-texturing treatment may be performed by a wet method using a strong acid, e.g., nitric acid and hydrofluoric acid, or a strong base, e.g., sodium hydroxide, or by a dry method using plasma.

The semiconductor substrate 110 may be doped with an n-type impurity, as an example. The n-type impurity may be doped by diffusing $POCl_3$ or $H_3PO_4$ at a higher temperature. Thus, the semiconductor substrate 110 may include a lower semiconductor layer 110a and an upper semiconductor layer 110b doped with different impurities from each other.

A conductive paste for a front electrode 123 may be applied on the upper semiconductor layer 110b. The conductive paste for a front electrode 123 may be provided by a screen printing method. The screen printing method includes applying the conductive paste including a conductive powder, a metallic glass, and an organic vehicle at the position where a front electrode 123 is to be positioned, and drying the same.

As described above, the conductive paste may include a metallic glass, and the metallic glass may be prepared using any kind of method, e.g., melt spinning, infiltration casting, gas atomization, ion irradiation, or mechanical alloying. The conductive paste for a front electrode 123 is dried.

A dielectric layer 130 may be provided by stacking aluminum oxide ($Al_2O_3$) or silicon oxide ($SiO_2$) on the rear side of the semiconductor substrate 110, as an example, by a plasma enhanced chemical vapor deposition (PECVD) method.

A plurality of through-holes 135 may be provided on one part of the dielectric layer 130 by an ablation with a laser.

The conductive paste for a rear electrode 143 may be subsequently applied on one side of the dielectric layer 130 by a screen printing method. The conductive paste for a rear electrode 143 may then be dried.

The conductive paste for a front electrode 123 and the conductive paste for a rear electrode 143 are co-fired. Alternatively, the conductive paste for a front electrode 123 and the conductive paste 143 for a rear electrode may be respectively fired.

The firing may be performed at a higher temperature than the melting temperature of the conductive metal in a furnace, for example, at a temperature ranging from about 200° C. to about 1000° C.

Figure 4:
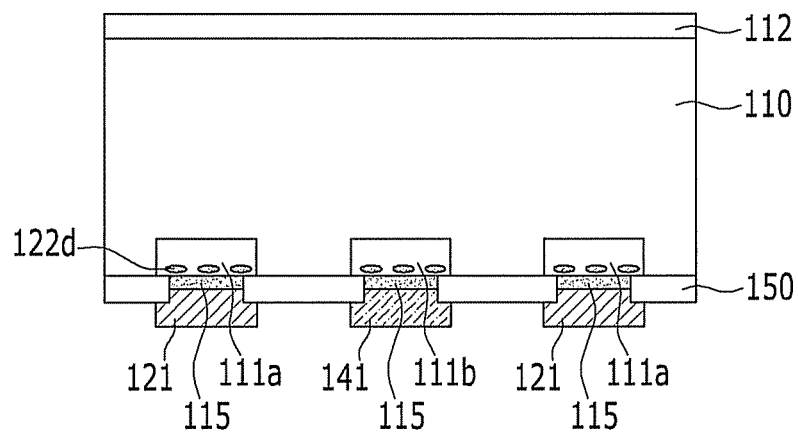

Hereinafter, a solar cell according to example embodiments is described referring to FIG. 4. FIG. 4 is a cross-sectional view showing a solar cell according to example embodiments.

A solar cell 300 according to example embodiments may include a semiconductor substrate 110 doped with a p-type or an n-type impurity. The semiconductor substrate 110 may include a plurality of first doping regions 111a and second doping regions 111b on the rear side and may be doped with different impurities from each other. For example, the first doping regions 111a may be doped with an n-type impurity, and the second doping regions 111b may be doped with a p-type impurity. The first doping regions 111a and the second doping regions 111b may be alternately disposed on the rear side of the semiconductor substrate 110.

The front side of the semiconductor substrate 110 may be surface-textured, and therefore may enhance the light-absorption rate and decrease the reflectivity, thereby improving efficiency of a solar cell.

An insulation layer 112 may be provided on the semiconductor substrate 110. The insulation layer 112 may be formed of an insulating material that absorbs relatively little light, for example, at least one of silicon nitride ($SiN_x$), silicon oxide ($SiO_2$), titanium oxide ($TiO_2$), aluminum oxide ($Al_2O_3$), magnesium oxide (MgO), cerium oxide ($CeO_2$), and/or a combination thereof. The insulation layer 112 may be a single layer or more than one layer. The insulation layer 112 may have a thickness ranging from about 200 Å to about 1500 Å.

The insulation layer 112 may be an anti-reflective coating (ARC) that decreases the reflectivity of light and increases selectivity of a particular wavelength on the surface of the solar cell, and simultaneously improves contact characteristics with silicon at the surface of the semiconductor substrate 110, thereby increasing efficiency of the solar cell.

A dielectric layer 150 having a plurality of through-holes (see FIG. 3) may be disposed on the rear side of the semiconductor substrate 110.

A first electrode connected with the first doping region 111a and a second electrode connected with the second doping region 111b are disposed on the rear side of the semiconductor substrate 110, respectively. The first electrode and the first doping region 111a may contact each other through a through-hole (see FIG. 3), and the second electrode and the second doping region 111b may contact each other through a through-hole (see FIG. 3). The first electrode and the second electrode may be alternately disposed.

The first electrode may include a buffer layer 115 positioned at a region which is adjacent to the first doping region 111a, and a first electrode portion 121 positioned at a region other than a region where the buffer layer 115 is formed. The second electrode may include a buffer layer 115 positioned at a region which is adjacent to the second doping region 111b, and a second electrode portion 141 positioned at a region other than a region where the buffer layer 115 is formed. However, example embodiments are not limited thereto. The buffer layer 115 may be omitted, or may be formed on a region adjacent to the first doping region 111a, a region adjacent to the second doping region 111b, and/or a combination thereof.

As described in example embodiments, the first electrode and the second electrode are formed using a conductive paste including a conductive powder, a metallic glass, and an organic vehicle.

The buffer layer 115 may be disposed between the first doping region 111a and the first electrode portion 121, and between the second doping region 111b and the second electrode portion 141. The buffer layer 115 may have conductivity due to a metallic glass. Because the conductive buffer layer 115 has portions contacting the first electrode portion 121 or the second electrode portion 141 and portions contacting the first doping region 111a or the second doping region 111b, undesirable loss of electric charges may decrease by enlarging the path for transferring charges between the first doping region 111a and the first electrode portion 121, or between the second doping region 111b and the second electrode portion 141.

In addition, at least one of the buffer layer 115, the first doping region 111a, the second doping region 111b, the interface of the first doping region 111a and the buffer layer 115, and the interface of the second doping region 111b of the semiconductor substrate 110 and the buffer layer 115 includes a crystallized conductive powder 122d. The crystallized conductive powder 122d may be melted and passed through the buffer layer 115 and diffused into the first doping region 111a and/or the second doping region 111b of conductive substrate 110 during the baking process when the first electrode and/or the second electrode is provided using the conductive powder 122c, and crystallized. The crystallized conductive powder 122d may decrease the contact resistance between the first doping region 111a and the first electrode portion 121 and between the second doping region 111b and the second electrode portion 141 and improve the electrical characteristics of solar cell.

The solar cell according to example embodiments including both the first electrode and the second electrode on the rear surface of the solar cell may decrease an area where a metal is positioned on the front surface, which may decrease shadowing loss and increase solar cell efficiency.

Hereinafter, the method of manufacturing a solar cell will be described, referring to FIG. 4.

A semiconductor substrate 110 doped with, for example, an n-type impurity is prepared. The semiconductor substrate 110 may be surface-textured, and an insulation layer 112 and a dielectric layer 150 may be disposed on the front side and the rear side of the semiconductor substrate 110, respectively. The insulation layer 112 and the dielectric layer 150, as an example, may be formed by chemical vapor deposition (CVD).

The first doping region 111a and the second doping region 111b may be formed by sequentially doping a p-type impurity and an n-type impurity at a higher concentration on the rear side of the semiconductor substrate 110. A conductive paste for a first electrode may be applied on one side of the dielectric layer 150 corresponding to the first doping region 111a, and a conductive paste for a second electrode may be applied on the other side corresponding to the second doping region 111b. The conductive paste for a first electrode and the conductive paste for a second electrode may be provided by a screen printing method, and the conductive paste including the conductive powder, metallic glass, and organic vehicle described above may be respectively used.

The conductive paste for a first electrode and the conductive paste for a second electrode may be fired together or respectively. The firing may be performed at a higher temperature than the melting temperature of a conductive metal in a furnace.

The aforementioned conductive paste is illustrated as an example of being applied to an electrode for a solar cell, but is not limited thereto, and may be applied to an electrode for all electronic devices.

The following examples illustrate this disclosure in more detail. However, it is understood that this disclosure is not limited by these examples.

Measuring Solid Solubility of Silver (Ag)

EXAMPLE 1

A metallic glass of $Cu_{46}Zr_{46}Al_8$ is prepared in a form of a ribbon having a thickness of about 90 μm and a width of about 0.5 cm. The metallic glass ribbon is cut to have a length of 1 cm and coated with silver (Ag) paste including 85 wt % of silver (Ag). The metallic glass ribbon is heated at about 650° C. for about 30 minutes while being exposed to air to provide a conductive thin film. The heating treatment is performed at a speed of about 50° C./min.

EXAMPLE 2

A conductive thin film is provided on the metallic glass ribbon in accordance with the same procedure as in Example 1, except that the metallic glass is $Cu_{58.1}Zr_{35.9}Al_6$ instead of $Cu_{46}Zr_{46}Al_8$.

COMPARATIVE EXAMPLE 1

A conductive thin film is provided on the metallic glass ribbon in accordance with the same procedure as in Example 1, except that the metallic glass is $Cu_{50}Zr_{50}$ instead of $Cu_{46}Zr_{46}Al_8$.

Assessment—1

The metallic glass ribbons and the conductive thin films obtained from Examples 1 and 2 and Comparative Example 1 are cut and analyzed regarding the cross-sectional surface.

Table 1 shows the solid solubility of silver (Ag) present in the metallic glass ribbon at a place apart from the interface of the metallic glass ribbon and the conductive thin film obtained from each of Examples 1 and 2 and Comparative Example 1 by about 3 μm. The solid solubility of silver (Ag) is determined by measuring the silver concentration (at %) in the interface of the metallic glass ribbon and the conductive thin film at a depth of about 3 μm through energy dispersive x-ray spectroscopy (EDS).

TABLE 1

| | Silver (Ag) solid solubility (at %) |
|---|---|
| Example 1 | 8 |
| Example 2 | 5 |
| Comparative Example 1 | 1 |

Referring to Table 1, the metallic glass ribbons obtained from Examples 1 and 2 have more silver (Ag) in the solid solution than that of the metallic glass ribbon according to Comparative Example 1. In addition, it is confirmed that Example 1 including metallic glass having a relatively high amount of aluminum (Al) has a higher silver (Ag) solid-solubility than that of Example 2.

Preparing Conductive Paste and Electrode

EXAMPLE 3

Silver (Ag) powder and metallic glass of $Cu_{46}Zr_{46}Al_8$ are added into an organic vehicle including an ethyl cellulose binder and a butyl carbitol solvent. The silver (Ag) powder, the metallic glass of $Cu_{46}Zr_{46}Al_8$, and the organic vehicle are mixed at about 84 wt %, about 4 wt %, and about 12 wt %, respectively, based on the total amount of conductive paste.

The mixture is kneaded using a 3-roll mill to provide a conductive paste.

The conductive paste is coated on a silicon wafer by a screen printing method, rapidly heated to about 500° C. using a belt furnace, and slowly heated to about 900° C. The conductive paste is cooled to provide an electrode.

EXAMPLE 4

A conductive paste is prepared in accordance with the same procedure as in Example 3 to provide an electrode, except that $Cu_{58.1}Zr_{35.9}Al_6$ is used as a metallic glass instead of $Cu_{46}Zr_{46}Al_8$.

COMPARATIVE EXAMPLE 2

A conductive paste is prepared in accordance with the same procedure as in Example 3 to provide an electrode, except that $Cu_{50}Zr_{50}$ is used as a metallic glass instead of $Cu_{46}Zr_{46}Al_8$.

Assessment—2

Each contact resistance of electrodes obtained from Examples 3 and 4 is compared to that of Comparative Example 2. The contact resistance is determined by a transfer length method (TLM).

Table 2 shows the contact resistance of each electrode obtained from Examples 3 and 4 and Comparative Example 2.

TABLE 2

| | Contact resistance (mΩcm$^2$) |
|---|---|
| Example 3 | 35.60 |
| Example 4 | 40.07 |
| Comparative Example 2 | 60.57 |

As shown in Table 2, the electrodes obtained from Examples 3 and 4 have lower contact resistance than the electrode obtained from Comparative Example 2. Thereby, the contact resistance is decreased by using a metallic glass including aluminum (Al) that is capable of providing a solid-solution with silver (Ag). In addition, the contact resistance is further decreased by using a metallic glass having an increased amount of aluminum (Al) to further increase the solid-solubility with silver (Ag).

While this disclosure has been described in connection with what is presently considered to be example embodiments, it is to be understood that the inventive concepts are not limited to the disclosed embodiments, but, on the contrary, are intended to cover various modifications and equivalent arrangements included within the spirit and scope of the appended claims.

What is claimed is:

1. A conductive paste comprising:
   a conductive powder;
   a metallic glass, the metallic glass being an alloy having a disordered structure, the metallic glass including a first element having a heat of mixing value with the conductive powder of less than 0; and
   an organic vehicle.

2. The conductive paste of claim 1, wherein a eutectic temperature of the conductive powder and the first element is lower than a firing temperature of the conductive paste.

3. The conductive paste of claim 2, wherein the conductive paste has a firing temperature of about 1000° C. or less.

4. The conductive paste of claim 3, wherein the firing temperature of the conductive paste ranges from about 200 to about 1000° C.

5. The conductive paste of claim 1, wherein the first element is one of lanthanum (La), cerium (Ce), praseodymium (Pr), promethium (Pm), samarium (Sm), lutetium (Lu), yttrium (Y), neodymium (Nd), gadolinium (Gd), terbium (Tb), dysprosium (Dy), holmium (Ho), erbium (Er), thulium (Tm), thorium (Th), calcium (Ca), scandium (Sc), barium (Ba), beryllium (Be), bismuth (Bi), germanium (Ge), lead (Pb), ytterbium (Yb), strontium (Sr), europium (Eu), zirconium (Zr), thallium (Tl), lithium (Li), hafnium (Hf), magnesium (Mg), phosphorus (P), arsenic (As), palladium (Pd), gold (Au), plutonium (Pu), gallium (Ga), aluminum (Al), copper (Cu), zinc (Zn), antimony (Sb), silicon (Si), tin (Sn), titanium (Ti), cadmium (Cd), indium (In), platinum (Pt), and mercury (Hg).

6. The conductive paste of claim 1, wherein the metallic glass further comprises a second element and a third element, and
   the metallic glass is a composition represented by the following Chemical Formula 1:

$$A_x\text{-}B_y\text{-}C_z \qquad \text{[Chemical Formula 1]}$$

wherein, in the Chemical Formula 1, A, B, and C are the first element, the second element, and the third element, respectively; x, y, and z are composition ratios of the first element, the second element, and the third element, respectively; and x+y+z=100.

7. The conductive paste of claim 6, wherein the first element, the second element, and the third element are included in a ratio satisfying the following Equation 1:

$$xy\Delta H_1 + yz\Delta H_2 + zx\Delta H_3 < 0 \qquad \text{[Equation 1]}$$

wherein, in Equation 1, $\Delta H_1$ is a heat of mixing value for the first element and the second element; $\Delta H_2$ is a heat of mixing value for the second element and the third element; and $\Delta H_3$ is a heat of mixing value for the third element and the first element.

8. The conductive paste of claim 1, wherein the metallic glass further comprises a second element, a third element, and a fourth element, and
   the metallic glass is a composition represented by the following Chemical Formula 2:

$$A_x\text{-}B_y\text{-}C_z\text{-}D_w \qquad \text{[Chemical Formula 2]}$$

wherein, in the Chemical Formula 2, A, B, C, and D are the first element, the second element, the third element, and the fourth element, respectively; x, y, z, and w are composition ratios of the first element, the second element, the third element, and the fourth element, respectively; and x+y+z+w=100.

9. The conductive paste of claim 8, wherein the first element, the second element, the third element, and the fourth element are included in a ratio satisfying the following Equation 2:

$$xy\Delta H_1 + yz\Delta H_2 + zw\Delta H_3 + wx\Delta H_4 + xz\Delta H_5 + yw\Delta H_6 < 0 \quad \text{[Equation 2]}$$

wherein, in Equation 2, $\Delta H_1$ is a heat of mixing value for the first element and the second element, $\Delta H_2$ is a heat of mixing value for the second element and the third element, $\Delta H_3$ is a heat of mixing value for the third element and the fourth element, $\Delta H_4$ is a heat of mixing value for the fourth element and the first element, $\Delta H_5$ is a heat of mixing value for the first element and the third element, and $\Delta H_6$ is a heat of mixing value for the second element and the third element.

10. The conductive paste of claim 1, wherein the conductive powder has resistivity of about 100 μΩcm or less.

11. The conductive paste of claim 1, wherein the conductive powder comprises at least one of silver (Ag), aluminum (Al), copper (Cu), nickel (Ni), and a combination thereof.

12. The conductive paste of claim 1, wherein the conductive powder, the metallic glass, and the organic vehicle are included at about 30 to 99w %, about 0.1 to 20 wt %, and about 0.9 to 69.9 wt %, respectively, based on the total amount of the conductive paste.

13. An electronic device comprising,
an electrode formed using the conductive paste of claim 1.

14. A solar cell comprising:
an electrode electrically connected to a semiconductor layer and formed using the conductive paste of claim 1.

15. The solar cell of claim 14, wherein the electrode comprises a buffer layer at a region adjacent to the semiconductor layer, and an electrode portion at another region different from the region where the buffer layer is formed.

16. The solar cell of claim 15, wherein at least one of the buffer layer, the interface of the semiconductor layer and the buffer layer, and the semiconductor layer comprises a conductive material that is crystallized.

17. The solar cell of claim 14, wherein the conductive powder and the first element have a eutectic temperature lower than a firing temperature of the conductive paste.

18. The solar cell of claim 17, wherein the conductive paste has a firing temperature of lower than about 1000° C.

19. The solar cell of claim 14, wherein the first element comprises one of lanthanum (La), cerium (Ce), praseodymium (Pr), promethium (Pm), samarium (Sm), lutetium (Lu), yttrium (Y), neodymium (Nd), gadolinium (Gd), terbium (Tb), dysprosium (Dy), holmium (Ho), erbium (Er), thulium (Tm), thorium (Th), calcium (Ca), scandium (Sc), barium (Ba), beryllium (Be), bismuth (Bi), germanium (Ge), lead (Pb), ytterbium (Yb), strontium (Sr), europium (Eu), zirconium (Zr), thallium (Tl), lithium (Li), hafnium (Hf), magnesium (Mg), phosphorus (P), arsenic (As), palladium (Pd), gold (Au), plutonium (Pu), gallium (Ga), aluminum (Al), copper (Cu), zinc (Zn), antimony (Sb), silicon (Si), tin (Sn), titanium (Ti), cadmium (Cd), indium (In), platinum (Pt), and mercury (Hg).

20. The solar cell of claim 14, wherein the metallic glass further comprises a second element and a third element, and the metallic glass is a composition represented by the following Chemical Formula 1:

$$A_x\text{-}B_y\text{-}C_z$$

wherein, in the Chemical Formula 1, A, B, and C are the first element, the second element, and the third element, respectively; x, y, and z are composition ratios of the first element, the second element, and the third element, respectively; and x+y+z=100.

21. The solar cell of claim 20, wherein the first element, the second element, and the third element are included in a ratio satisfying the following Equation 1:

$$xy\Delta H_1 + yz\Delta H_2 + zx\Delta H_3 < 0 \quad \text{[Equation 1]}$$

wherein, in Equation 1, $\Delta H_1$ is a heat of mixing value for the first element and the second element, $\Delta H_2$ is a heat of mixing value for the second element and the third element, and $\Delta H_3$ is a heat of mixing value for the third element and the first element.

22. The solar cell of claim 14, wherein the metallic glass further comprises a second element, a third element, and a fourth element, and
the metallic glass has a composition represented by the following Chemical Formula 2:

$$A_x\text{-}B_y\text{-}C_z\text{-}D_w \quad \text{[Chemical Formula 2]}$$

wherein, in the Chemical Formula 2, A, B, C, and D are the first element, the second element, the third element, and the fourth element, respectively; x, y, z, and w are composition ratios of the first element, the second element, the third element, and the fourth element, respectively; and x+y+z+w=100.

23. The solar cell of claim 22, wherein the first element, the second element, the third element, and the fourth element are included in a ratio satisfying the following Equation 2:

$$xy\Delta_1 + yz\Delta H_2 + zw\Delta H_3 + wx\Delta H_4 + xz\Delta H_5 + yw\Delta H_6 < 0 \quad \text{[Equation 2]}$$

wherein, in Equation 2, $\Delta H_1$ is a heat of mixing value for the first element and the second element, $\Delta H_2$ is a heat of mixing value for the second element and the third element, $\Delta H_3$ is a heat of mixing value for the third element and the fourth element, $\Delta H_4$ is a heat of mixing value for the fourth element and the first element, $\Delta H_5$ is a heat of mixing value for the first element and the third element, and $\Delta H_6$ is a heat of mixing value for the second element and the third element.

24. The solar cell of claim 14, wherein the conductive powder has resistivity of about 100 μΩcm or less.

25. The solar cell of claim 14, wherein the conductive powder comprises at least one of silver (Ag), aluminum (Al), copper (Cu), nickel (Ni), and a combination thereof.

26. The conductive paste of claim 1, wherein
the metallic glass has one of three element and four elements,
the metallic glass includes copper (Cu), zirconium (Zr), and aluminum (Al), and
the conductive powder includes at least one of silver (Ag), a silver alloy, aluminum (Al), an aluminum alloy, copper (Cu), a copper alloy, nickel (Ni), a nickel alloy, and a combination thereof.

27. The conductive paste of claim 1, wherein the metallic glass includes beryllium (Be).

* * * * *